United States Patent
Sakuma

(10) Patent No.: US 6,782,074 B2
(45) Date of Patent: Aug. 24, 2004

(54) OPTICAL MEMBER FOR PHOTOLITHOGRAPHY AND METHOD FOR EVALUATING THE SAME

(75) Inventor: Shigeru Sakuma, Chigasaki (JP)

(73) Assignee: Nikon Corporation, Tokyo (JP)

( * ) Notice: Subject to any disclaimer, the term of this patent is extended or adjusted under 35 U.S.C. 154(b) by 114 days.

(21) Appl. No.: 10/304,961

(22) Filed: Nov. 27, 2002

(65) Prior Publication Data

US 2003/0112501 A1 Jun. 19, 2003

(30) Foreign Application Priority Data

Nov. 29, 2001 (JP) ........................................ 2001-363584

(51) Int. Cl.⁷ .............................................. G01N 23/20
(52) U.S. Cl. .......................................... 378/70; 378/70
(58) Field of Search ............................. 378/73, 70, 71; 356/30, 31

(56) References Cited

U.S. PATENT DOCUMENTS 6,055,293 A * 4/2000 Secrest ........................ 378/70

* cited by examiner

Primary Examiner—David V. Bruce
Assistant Examiner—Hoon Song
(74) Attorney, Agent, or Firm—Oliff & Berridge PLC

(57) ABSTRACT

A method for evaluating an optical member for photolithography composed of a fluoride crystal comprises a step of measuring a crystal plane orientation of the optical member, and a step of specifying a twin region on the basis of a result of the measurement. The twin region in an effective region of an optical element is specified as a total area of a region obtained by projection onto a plane perpendicular to an optical axis of the optical element. It is judged that the optical member is usable when the total area is not more than 10% of an effective diametric area or a partial diametric area of the optical element. The obtained optical element has satisfactory image formation characteristics because of less birefringence.

21 Claims, 13 Drawing Sheets

[111] Axis

→ [111] Axis
⋯⋯▸ [110] Axis

[100] Axis

---▸ [100] Axis
⋯⋯▸ [110] Axis

[110] Axis

→ [111] Axis
---▸ [100] Axis
⋯⋯▸ [110] Axis

Fig. 7
[111] Axis x 2 Lens
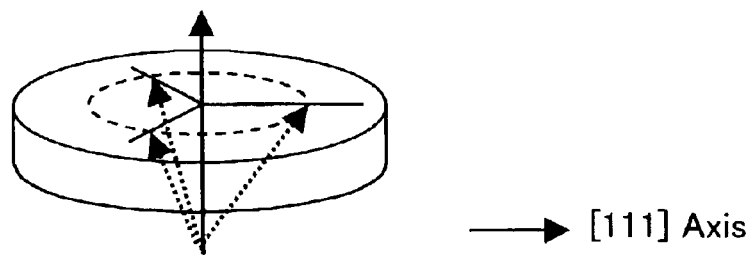
+60 deg. clocking
⟶ [111] Axis
┈┈▶ [110] Axis
Fig. 8
[100] Axis x 2 Lens
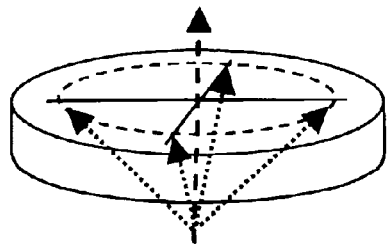
+45 deg. clocking
-- -▶ [100] Axis
┈┈▶ [110] Axis
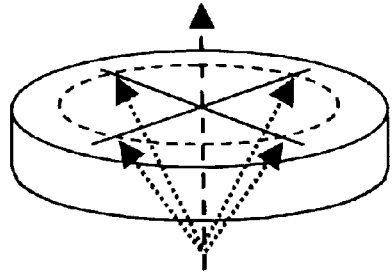

→ <111> AXIS ORIENTATION
⇒ <100> AXIS ORIENTATION

OPTICAL MEMBER FOR PHOTOLITHOGRAPHY AND METHOD FOR EVALUATING THE SAME

BACKGROUND OF THE INVENTION

1. Field of the Invention

The present invention relates to an optical member composed of a fluoride crystal as a raw material for producing an optical element for constructing an optical system of an optical instrument such as a camera, a microscope, a telescope as well as of a projection exposure apparatus for photolithography such as a stepper, and a method for evaluating the same. The present invention also relates to an optical system and a projection exposure apparatus incorporated with an optical element produced of the optical member.

2. Description of the Related Art

In recent years, the lithography technique for drawing an integrated circuit pattern on a wafer is rapidly advanced. The demand to increase the degree of integration of the integrated circuit is growing year after year. In order to realize the high degree of integration, it is necessary to enhance the resolving power of the projection optical system of the projection exposure apparatus. The resolving power of the projection optical system is determined by the wavelength of a light beam to be used and NA (numerical aperture) of the projection optical system. That is, the resolving power can be increased by further shortening the wavelength of the light beam to be used (realization of short wavelength) and/or further increasing NA of the projection optical system (realization of large diameter).

At first, a description will be made about the realization of the short wavelength of the light beam. The wavelength of the light source to be used for the projection exposure apparatus has been already changed to the g-ray (wavelength: 436 nm) and the i-ray (wavelength: 365 nm). It is investigated to use light beams having shorter wavelengths in the future, including, for example, the KrF excimer laser light beam (wavelength: 248 nm) and the ArF excimer laser light beam (wavelength: 193 nm). However, if commonly used multicomponent optical glass is used as a lens material for an image-forming optical system such as a projection optical system to be used for the light beam as described above, the transmittance is considerably lowered.

Therefore, silica glass or fluoride crystal, for example calcium fluoride crystal is generally used as an optical member for the optical system of the projection exposure apparatus which uses the excimer laser as the light source. In order to satisfy the image formation performance required for the optical member to be used for the optical system of the excimer laser projection exposure apparatus, it is desirable to use a single crystal in the case of a crystalline material.

As the performance of the projection exposure apparatus is highly enhanced, a calcium fluoride single crystal having a large diameter, i.e., a diameter of about $\phi 120$ mm to $\phi 350$ mm is recently required in order to increase NA. Such a calcium fluoride single crystal has a small refractive index and a small dispersion (dependency of the refractive index on the wavelength) as compared with the commonly used optical glass and the silica glass. Therefore, a merit is also obtained such that the chromatic aberration can be corrected by using the calcium fluoride single crystal together with the optical member composed of a material such as silica glass. It is also possible to obtain a single crystal having a large diameter exceeding $\phi 120$ mm.

The calcium fluoride single crystal, which has the advantages as described above, has been hitherto used as lens materials for cameras, microscopes, and telescopes other than as the optical material for the projection exposure apparatus. Recently, single crystals of barium fluoride and strontium fluoride, which are fluoride single crystals other than the calcium fluoride single crystal, attract the attention as optical materials for the next generation, because they belong to the same cubic system and they have similar properties.

A variety of single crystal growth methods are known as the method for producing the fluoride single crystal, including, for example, the melt method such as the Tammann method and the Bridgman method (also referred to as the Stockbarger method or the pull-down method). A method for producing the calcium fluoride single crystal based on the Bridgman method will be described below by way of example. FIG. 2 conceptually shows a growth apparatus for the calcium fluoride single crystal based on the Bridgman method.

In order to produce the calcium fluoride single crystal for the purpose of the use in the ultraviolet or vacuum ultraviolet region, a calcium fluoride raw material having high purity, which is produced by means of chemical synthesis, is generally used as the raw material. If any powder is used as the raw material to grow the crystal, the volume is greatly decreased when the raw material is melted. In order to avoid such an inconvenience, the crystal is generally grown by using a raw material obtained by semi-melting the powder once or obtained by crushing the product obtained by semi-melting the powder once.

At first, a crucible, which is filled with a semi-molten material or a crushed material thereof, is set in the growth apparatus. The interior of the growth apparatus is maintained in a vacuum atmosphere of $10^{-3}$ to $10^{-4}$ Pa. Subsequently, the temperature in the growth apparatus is raised to a temperature which is not less than the melting point of calcium fluoride (1370° C. to 1450° C.) to melt the raw material.

At the crystal growth (grain growth) stage, the crucible is moved downwardly at a speed of about 0.1 to 5 mm/h, and thus the crystal growth is gradually advanced from the lower portion of the crucible. The crystal growth comes to an end when the uppermost portion of the melt is crystallized. The grown crystal (ingot) is gradually cooled to a temperature in the vicinity of the room temperature so that the crystal (ingot) is not broken. After that, the interior of the growth apparatus is open to the atmospheric air, and the ingot is taken out.

A crucible made of graphite is generally used for the crystal growth. The crucible is pencil-shaped with its tip having a conical configuration. Therefore, the crystal growth is started from the tip having the conical configuration disposed at the bottom of the crucible. The crystallization is gradually advanced, and the ingot is finally obtained.

A seed crystal is sometimes introduced into the tip portion in order to control the crystal plane orientation of the ingot. However, in general, when a large fluoride crystal is produced by means of the Bridgman method, it is considered that the crystal growth orientation does not obey any law, and the crystal direction of the ingot is randomly determined every time when the crystal growth is performed. Especially, in the case of a large ingot having a diameter exceeding $\phi 120$ mm, it is extremely difficult to control the crystal plane orientation.

A large residual stress exists in the ingot taken out from the crucible after the crystal growth. Therefore, a simple heat treatment is performed while retaining the ingot shape as it is. The ingot of the calcium fluoride single crystal obtained as described above is cut and processed into an appropriate size depending on an objective product.

When an optical element, in which the crystal plane orientation causes no problem, is produced, the ingot is cut horizontally to have a parallel plate-shaped configuration (cut into round slices) in order to cut out raw materials from the ingot more efficiently. A heat treatment is applied to the cut raw materials in order to obtain desired image formation performance (uniformity of refractive index and reduction of stress induced birefringence).

When an optical element, in which the crystal plane orientation should be considered, is produced, for example, when the optical axis is made perpendicular to the {111} crystal plane, then the {111} crystal plane of the fluoride single crystal ingot is measured. The raw material is cut out so that the {111} plane resides in the two parallel planes, and then a heat treatment is performed.

It has been hitherto considered that the single crystal based on the cubic system has no intrinsic birefringence, or if any, the single crystal based on the cubic system has an intrinsic birefringence at a level at which no problem occurs. Therefore, it has been considered that the birefringence causes no serious problem in the optical design, for example, in the case of the single crystal of calcium fluoride provided that the birefringence, which is caused by the thermal stress in the production steps, is reduced to a level at which no problem occurs.

However, in recent years, the following fact has been revealed. That is, the intrinsic birefringence tends to depend on the wavelength. When the wavelength of the light beam to be used is longer than about 250 nm, then the intrinsic birefringence is small, and it can be almost neglected. On the other hand, the shorter the wavelength is, the larger the intrinsic birefringence is. For example, in the case of the {110} plane, it has been revealed that the values of the birefringence are not more than 0.2 nm/cm, 3.4 nm/cm, and 11.2 nm/cm for the light beams having wavelengths of 633 nm, 193 nm, and 157 nm respectively. The wavelength of 157 nm is the wavelength of the $F_2$ laser beam. It has been revealed that the influence of the intrinsic birefringence, which is exerted on the image formation performance of the optical system, cannot be neglected in relation to the light beam having a short wavelength as described above.

The way of distribution of the intrinsic birefringence in the optical element depends on the relationship between the optical element and the direction of the crystal. Therefore, the distribution also changes in accordance with the change of the relationship between the crystal plane orientation of the single crystal and the direction of the optical axis when the single crystal is processed and machined into an optical member. This fact will be briefly explained. FIG. 3 schematically shows the crystal plane orientations of the fluoride crystal based on the cubic system. As shown in FIG. 3, no birefringence exists in the directions of the [100] axis and the [111] axis. On the other hand, the birefringence is maximum in the direction of the [110] axis. The crystal plane orientations are represented in accordance with the Miller indexes. The Miller index is the inverse number of the value obtained by dividing the distance from the point of intersection between the crystal plane and each crystal axis to the lattice origin of the crystal by the lattice spacing of each crystal axis. For example, in the case of the cubic system as in calcium fluoride, all of the lattice spacings of the respective crystal axes are identical. Therefore, it is assumed that the lattice spacing is "a". On this assumption, when a certain crystal plane intersects the crystal axes at points separated from the lattice origin by a/h, a/k, and a/l respectively, the crystal plane orientation is represented as (hkl) with the Millar index. In this expression, h, k, and l are integers. According to the Millar index, the direction [hkl] is perpendicular to the crystal plane (hkl) in the cubic system. The directions, which are in a symmetric relation, are represented by one index to make representation with parentheses < >. The crystal planes, which are in a symmetric relation, are also represented by one index to make representation with parentheses { }. For example, all of the diagonal lines of the cube [111], [1-11], [-1-11], [-111] are represented by <111>. The crystal planes of the cube (100), (010), (-100), (0-10), (001), (00-1) are represented by {100}.

Therefore, for example, in the case of an optical system in which the <111> axis is coincident with the optical axis, the peaks of the birefringence distribution (birefringence symmetry axes) exist in the three directions as shown in FIG. 4. When the <100> axis is the optical axis, the birefringence symmetry axes exist in the four directions as shown in FIG. 5. When the <110> axis is the optical axis, the birefringence symmetry axes also exist in the four directions as shown in FIG. 6.

As explained above, it is appreciated that the intrinsic birefringence in the optical element is distributed depending on the crystalline orientation. In view of the above, a method has been suggested, in which the peaks of the birefringence distribution are counteracted with each other by combining a plurality of optical elements while rotating them so that they mutually have predetermined angles about the center of the optical axis. This is referred to as "clocking".

For example, FIG. 7 shows a state in which two optical members are arranged while mutually rotating the <110> axis by 60° about the center of the optical axis in an optical system in which the <111> axis is the optical axis. On the other hand, FIG. 8 shows a state in which two optical members are arranged while mutually rotating the <110> axis by 45° about the center of the optical axis in an optical system in which the <100> axis is the optical axis. Further, FIG. 9 shows a state in which four optical members are arranged while rotating the <111> axis and the <100> axis by 45°, 90°, and 135° respectively about the center of the optical axis in an optical system in which the <110> axis is the optical axis.

As described above, the influences on the image formation performance, which would be caused by the birefringence distributions of the respective optical elements, can be counteracted with each other by setting the plurality of optical members so that they mutually form predetermined angles (by performing the clocking). Accordingly, the point image intensity distribution (Strehl Intensity) is improved, and it is possible to avoid the deterioration of the image formation performance.

However, even when the clocking is performed, the image formation performance is not improved yet in some cases.

SUMMARY OF THE INVENTION

The present invention has been made in order to solve the problems involved in the conventional technique, an object of which is to provide an optical element composed of a fluoride crystal having satisfactory image formation performance. A second object of the present invention is to provide an optical element in which the occurrence of birefringence is sufficiently suppressed even in the case of a light beam having a short wavelength of not more than 250 nm, a projection optical system provided with the same, and a projection exposure apparatus provided with the same.

As a result of studies and investigations performed by the present inventors in order to solve the problems involved in the conventional technique, it has been found out that a region called twin exists in an optical element such as a lens obtained by processing a fluoride single crystal, and it has been ascertained that the twin generates a birefringence distribution and the image formation characteristics of the optical element are deteriorated thereby.

In general, the twin is formed such that two crystals, which have an identical chemical composition and an identical crystalline structure, are joined to one another in a relationship in which the two crystals are symmetrical with respect to a specified plane or axis. The two crystals as described above are related, for example, to have such crystal plane orientations that the <111> axes are in a mutually identical direction but the <100> are mutually inverted by 180 degrees. However, in this specification, for the convenience of explanation, the following terms are used for one in which the two crystals having the relationship as described above are joined to one another. That is, the crystal, which occupies the smaller region, is referred to as "twin", and the crystal portion, which occupies the smaller region, is referred to as "twin region". According to studies performed by the present inventors, the following fact has been revealed. That is, the distribution of birefringence differs between the twin portion and the other portion in an optical element in which the twin exists therein. Therefore, even when the clocking is performed, it is impossible to sufficiently reduce the polarity of the birefringence distribution.

According to a first aspect of the present invention, there is provided a method for evaluating an optical member for photolithography composed of a fluoride crystal, characterized by comprising the steps of:

measuring a crystal plane orientation of the optical member; and specifying a twin region on the basis of a result of the measurement. The present inventors have successfully obtained an optical element in which the birefringence distribution is suppressed, by specifying the twin region in the optical member on the basis of the knowledge described above, selecting only the optical member in which the twin region is not more than a predetermined ratio, and performing processing into the optical element by using the optical member. The evaluation method of the present invention may further comprise a step of calculating a ratio occupied by the specified twin region with respect to an effective region of the optical element to be produced from the optical member.

In the method for evaluating the optical member according to the present invention, the step of measuring the crystal plane orientation of the optical member may be performed by radiating an X-ray onto the optical member. In this procedure, the X-ray may be radiated onto the optical member on the basis of a Laue method, especially on the basis of the Laue method of a side surface reflection type.

The twin region may be specified as a total area of a region obtained by projecting the twin region in the effective region of the optical element to be produced from the optical member onto a plane perpendicular to an optical axis of the optical element. In this procedure, the effective region of the optical element is indicative of the region of light irradiation with the light beam which may be radiated onto the optical element. The effective region of the optical element may be an effective diametral area of the optical element or a partial diametral area of the optical element.

In order to evaluate the optical member, the method of the present invention may further comprise a step of judging that the optical member is usable when the total area is not more than 10% of the effective diametral area or the partial diametral area of the optical element.

According to a second aspect of the present invention, there is provided an optical element for photolithography to be used in a wavelength band in which a wavelength is not more than 250 nm, wherein:

a region, which is obtained by projecting a twin region of the optical element onto a plane perpendicular to an optical axis of the optical element, has a total area which is not more than 10% of an effective diametral area of the optical element. The optical element of the present invention has satisfactory image formation characteristics, because the optical element involves a small amount of the twin region which would cause the occurrence of the birefringence.

According to a third aspect of the present invention, there is provided an optical element for photolithography to be used in a wavelength band in which a wavelength is not more than 250 nm, wherein:

a region, which is obtained by projecting a twin region of the optical element onto a plane perpendicular to an optical axis of the optical element, has a total area which is not more than 10% of a partial diametral area of the optical element. The optical element of the present invention has satisfactory image formation characteristics, because the optical element involves a small amount of the twin region which would cause the occurrence of the birefringence.

According to a fourth aspect of the present invention, there is provided an optical system for photolithography to be used in a specified wavelength band in which a wavelength is not more than 250 nm, the optical system comprising:

the optical element according to the second or third aspect of the present invention; and a lens barrel into which the optical element is incorporated. The optical system for photolithography may be a projection optical system.

According to a fifth aspect of the present invention, there is provided an exposure apparatus for photolithography to be used in a specified wavelength band in which a wavelength is not more than 250 nm, wherein:

the optical system according to the fourth aspect of the present invention is incorporated.

According to a sixth aspect of the present invention, there is provided a method for producing an optical system for photolithography to be used in a specified wavelength band in which a wavelength is not more than 250 nm, characterized by comprising the steps of:

preparing an optical member which is judged to be usable by using the evaluation method of the present invention;

grinding and polishing the optical member and coating the optical member with an antireflection film or a reflection film to produce an optical element having a predetermined shape; and incorporating the optical element into a lens barrel to produce the optical system thereby.

According to a seventh aspect of the present invention, there is provided a method for producing an exposure apparatus for photolithography to be used in a specified wavelength band in which a wavelength is not more than 250 nm, characterized by comprising the steps of:

preparing an optical member which is judged to be usable by using the evaluation method of the present invention;

grinding and polishing the optical member and coating the optical member with an antireflection film or a reflection film to produce an optical element having a predetermined shape;

incorporating the optical element into a lens barrel to produce an optical system thereby; and attaching the optical system to a predetermined position of the exposure apparatus.

BRIEF DESCRIPTION OF THE DRAWINGS

FIG. 7 conceptually shows a combination of fluoride crystal optical members to use an optical axis of [111].

FIG. 8 conceptually shows a combination of fluoride crystal optical members to use an optical axis of [100].

DESCRIPTION OF THE PREFERRED EMBODIMENTS

Figure 10:
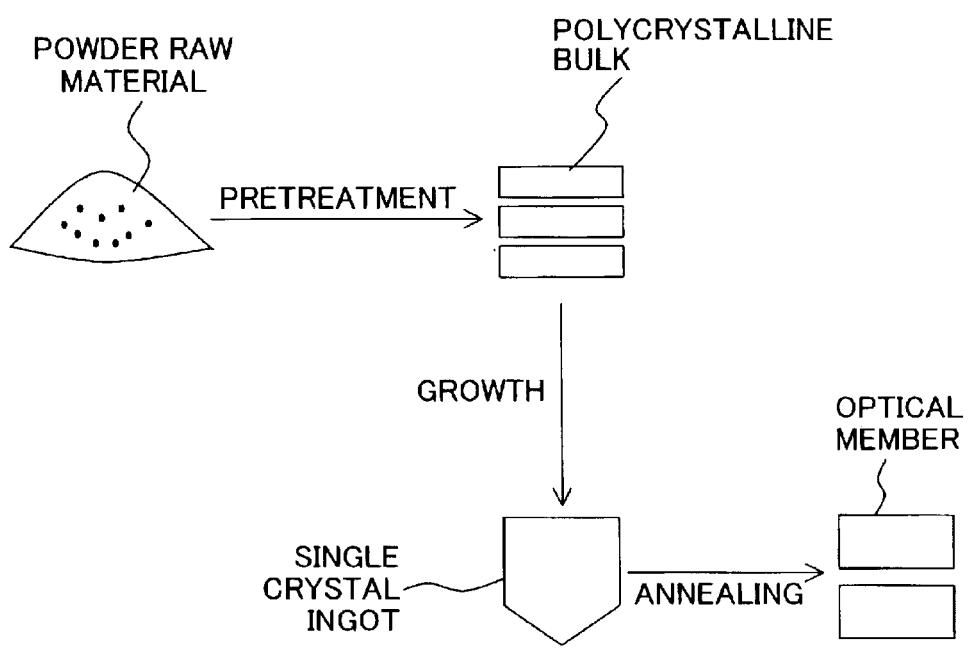
FIG. 10 conceptually shows steps of producing the fluoride crystal.

In the present invention, a method, which is equivalent to the method for producing the conventional fluoride crystal, is used in the step of growing the crystal. The method for growing the calcium fluoride single crystal based on the Bridgman method (the Stockbarger method or the pull-down method) will be explained below. FIG. 10 conceptually shows the process for growing the calcium fluoride single crystal.

A high purity powder produced by means of chemical synthesis is used as a raw material. At first, a semi-molten material is obtained from the powder raw material in accordance with the following procedure. Crucibles made of graphite, which are filled with the high purity powder raw material, are arranged and stacked in a melting apparatus. A powdery fluorinating agent is previously added to the powder raw material. Lead fluoride is used as the fluorinating agent. However, when fluorine-based macromolecular compound material such as tetrafluoroethylene resin is used, a semi-molten material having a higher purity is obtained. Accordingly, it can be expected that a crystal, in which less twin appears, may be finally obtained.

Figure 2:
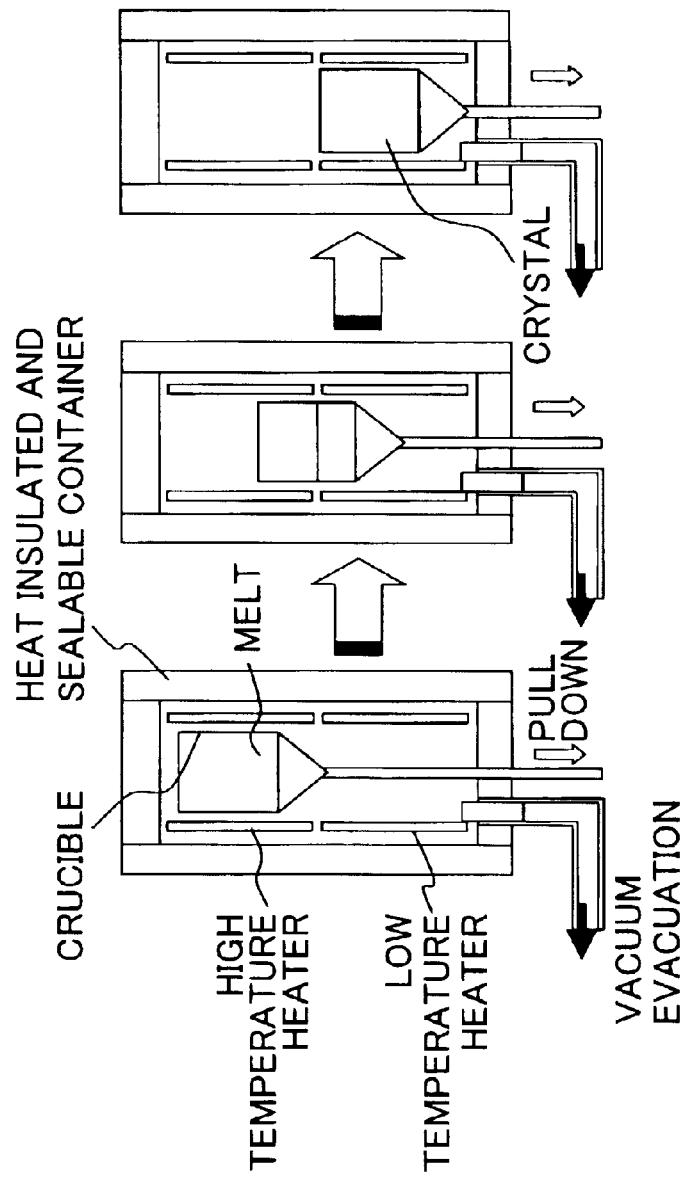
FIG. 2 conceptually shows a growth apparatus for a fluoride crystal in accordance with the Bridgman method.
Figure 3:
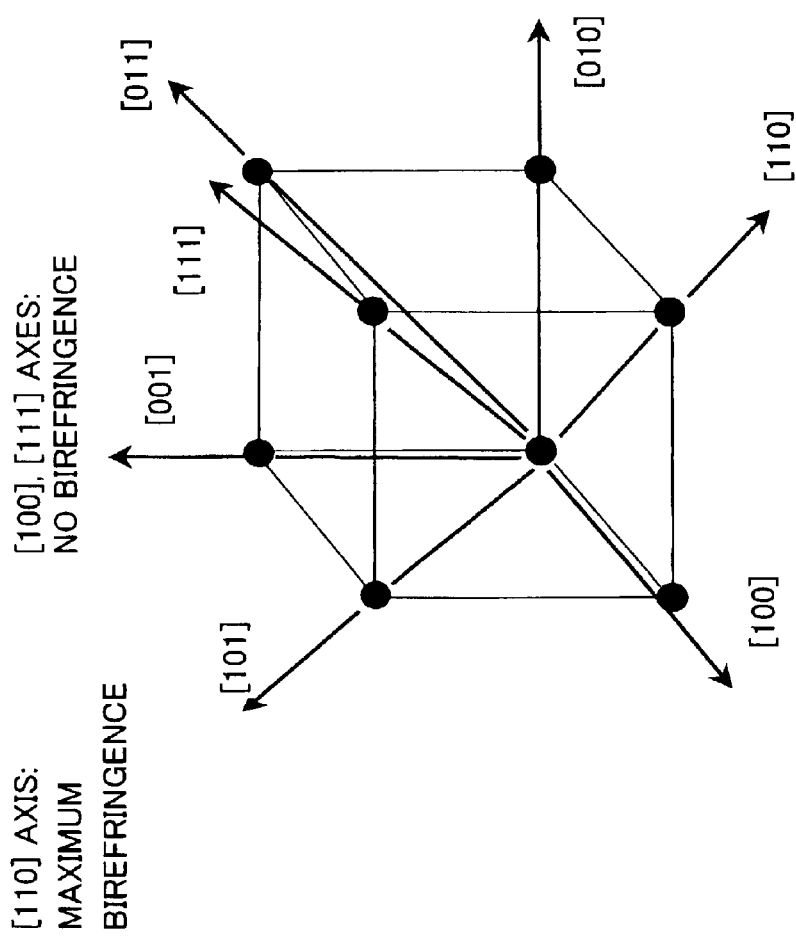
FIG. 3 schematically shows the crystal plane orientation of a fluoride single crystal of the cubic system.
Figure 4:
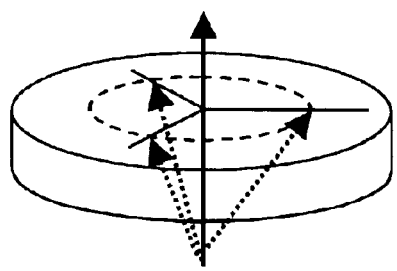
FIG. 4 conceptually shows a fluoride crystal optical member to use an optical axis of [111].
Figure 5:
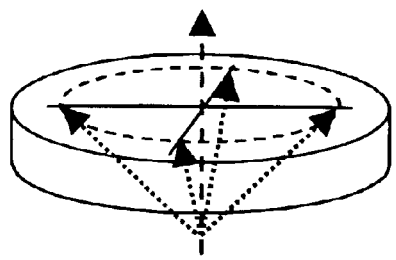
FIG. 5 conceptually shows a fluoride crystal optical member to use an optical axis of [100].
Figure 6:
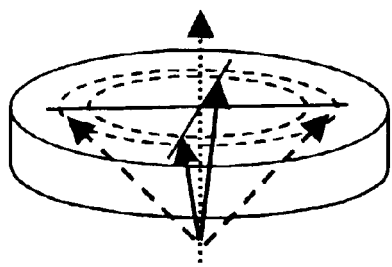
FIG. 6 conceptually shows a fluoride crystal optical member to use an optical axis of [110].
Figure 9:
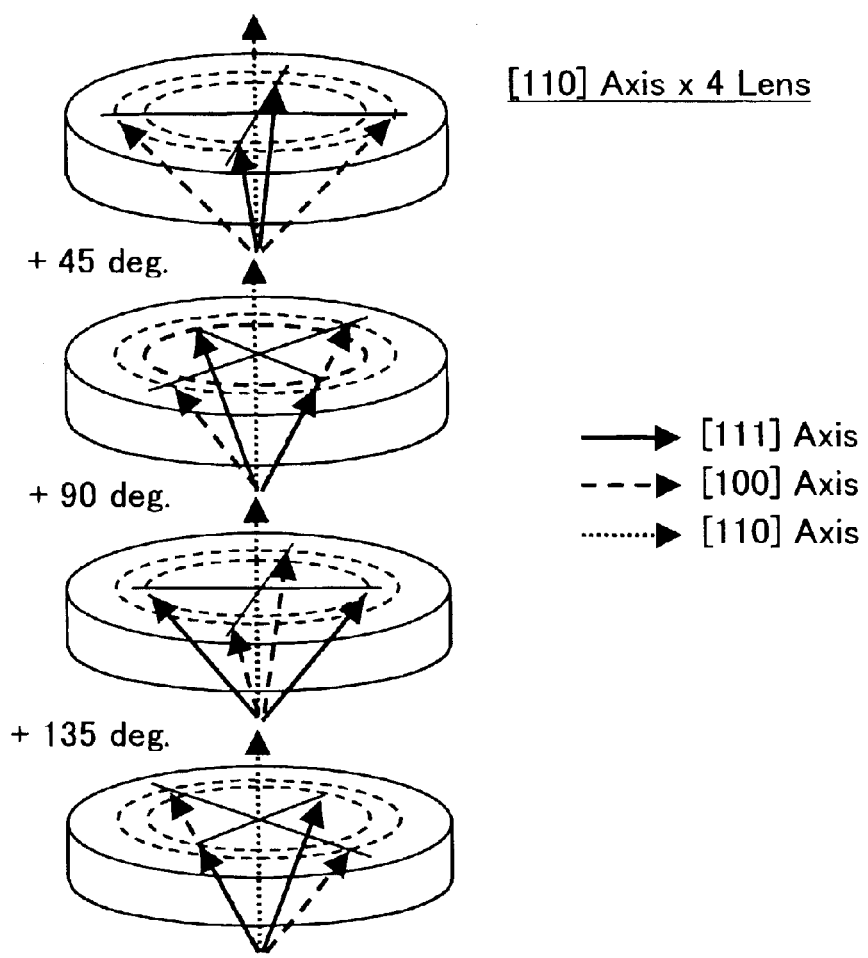
FIG. 9 conceptually shows a combination of fluoride crystal optical members to use an optical axis of [110].

Subsequently, the interior of the melting apparatus as shown in FIG. 2 is allowed to have a vacuum atmosphere of $10^{-3}$ to $10^{-4}$ Pa. This state is maintained, while the temperature in the melting apparatus is raised to a temperature of not less than the melting point of the raw material (1370° C. to 1450° C.) to melt the powder raw material, and then the temperature is lowered to the room temperature. During this process, it is desirable that the temperature in the melting apparatus is correctly controlled in accordance with the PID control. Subsequently, the semi-molten material is taken out from the crucible made of graphite.

The semi-molten material obtained as described above is introduced into a pencil-shaped crucible which is made of graphite for the crystal growth, which has a diameter of $\phi 300$ mm, and which has a conical tip. The crucible is set in a crystal growth furnace. Subsequently, the temperature in the crystal growth furnace is raised to a temperature of not less than the melting point of the raw material to melt the semi-molten material. Subsequently, the crucible is moved downwardly at a speed of about 0.1 to 5 mm/h. The lower portion of the crystal growth furnace is controlled to have a temperature which is not more than the melting point to cause the crystallization. Therefore, as the crucible is moved downwardly, the crucible is moved slowly to a temperature region to cause the crystallization. Accordingly, the crystallization is gradually advanced from the lower portion of the crucible. The crystal growth is completed when the crystallization is advanced up to the uppermost portion of the melt.

Subsequently, the interior of the crystal growth furnace is gradually cooled so that the grown crystal (ingot) is not broken. The interior of the crystal growth furnace is open to the atmospheric air to take out the ingot at the point of time at which the temperature is lowered to a temperature in the vicinity of the room temperature. Subsequently, the conical portion disposed at the tip of the ingot (referred to as "corn section") and the end surface portion disposed on the opposite side (referred to as "top section") are cut to have predetermined thicknesses to prepare test pieces for measuring the crystal plane orientation. The crystal plane orientation is measured for the test pieces in accordance with the Laue method to specify the crystal plane orientation of the ingot.

The method for evaluating the crystal plane orientation includes, for example, methods based on the X-ray, mechanical methods, and optical methods. Among them, in the case of the X-ray-based methods, the measurement can be performed highly accurately in a short period of time in a nondestructive manner. Among the X-ray-based methods, the Laue method is especially preferred for the present invention.

The ingot, for which the crystal plane orientation has been specified, is cut and processed into the parallel plate-shaped form in the direction which is suitable for processing the optical element having the desired crystal plane orientation. Subsequently, the twin is evaluated for the parallel plate-shaped material having been cut. The evaluation of the twin is basically based on the same principle as that of the specification of the crystal plane orientation by using the X-ray, in which the crystal plane orientation on the material surface is evaluated in more detail. The method based on the use of X-ray includes, for example, the Laue method, the rotation method, the vibration method, the Weissenberg method, and the precession method. However, the Laue method is also suitable for the present invention in this case.

As explained above, the twin is the crystal region having the crystal plane orientation which is in the symmetric relation with respect to the crystal plane orientation of the surrounding region. For example, when the twin region is compared with the surrounding region, the <111> axis is in the identical direction, while the <100> axis is inverted by 180°. Therefore, when the crystal plane orientation is evaluated in detail by using the X-ray, then it is possible to specify the region having the foregoing relation, and it is possible to know the degree of the ratio of the twin region with respect to the effective region of the optical element.

According to studies performed by the present inventors, it has been revealed that the image formation performance of the optical system is not deteriorated so much provided that the twin region is not more than 10% and more preferably not more than 5% with respect to the effective portion of the optical element to be produced. The method for evaluating the twin by using the X-ray will be explained in more detail below, as exemplified by the X-ray diffraction method. The X-ray diffraction method is a method in which the X-ray emitted from an X-ray tube is radiated onto a sample to cause the reflection, and the reflected X-ray is counted at a certain reflection angle by using a goniometer. The X-ray tube uses a target of Mo, Cu, W or the like in many cases. The X-ray is scattered by electrons possessed by atoms for constructing the substance. The substance is composed of a large number of atoms. Therefore, when the substance has any crystalline structure, the X-ray scattering phenomenon gives rise to a specific pattern. That is, strong scattering is observed in the case of only a certain specified angle of incidence with respect to the crystal. This is referred to as "Bragg reflection". A relationship of λ=2d×sin θ holds provided that d represents the interplanar spacing of the crystal, θ represents the angle of incidence and the angle of reflection, and λ represents the wavelength of the X-ray. This is referred to as "Bragg condition". According to this phenomenon, it is possible to know the atomic arrangement structure of the substance.

The Laue method is a type of the X-ray diffraction method, in which the white X-ray is radiated onto the fixed crystal. The respective crystal planes selectively diffract only the X-ray having the wavelength λ to satisfy the Bragg condition with respect to the interplanar spacing d and the angle of incidence or the angle of reflection θ respectively. The X-ray diffracted by the crystal planes is photographed with a Laue camera, and the atomic structure of the sample substance is analyzed according to an obtained photograph image pattern (Laue spot). The photograph image is analyzed by performing manual calculation or by incorporating the photograph image into a computer with a scanner to perform computation.

Figure 11:
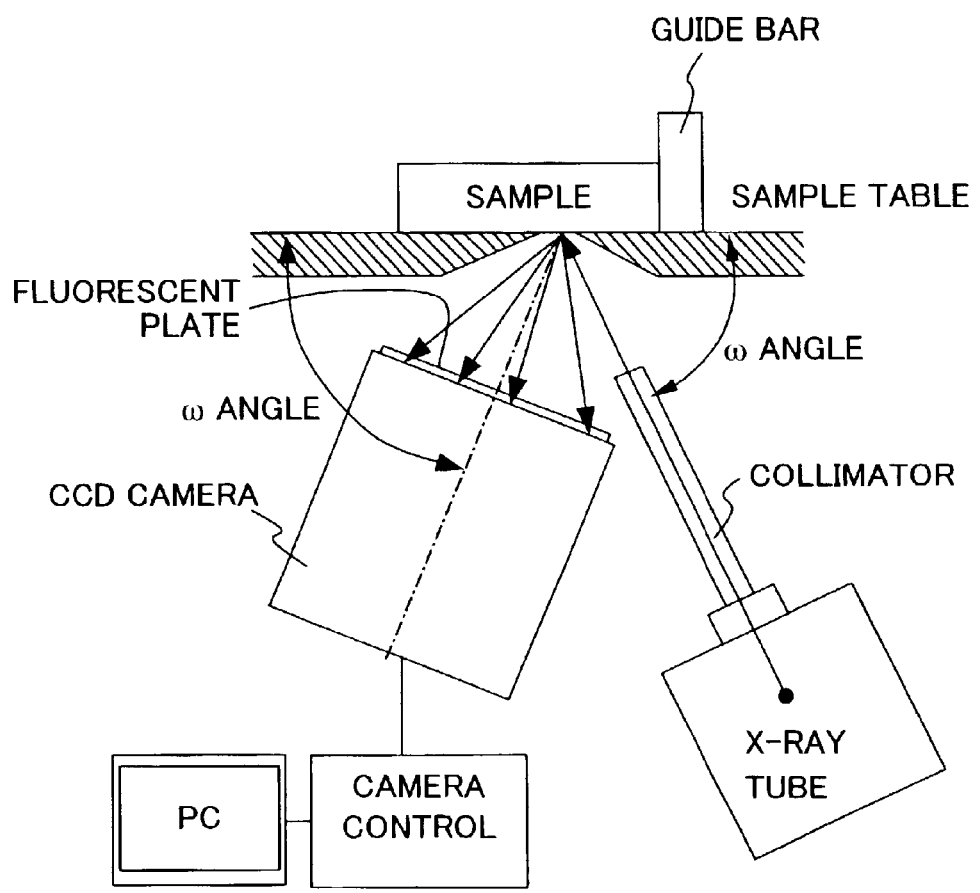
FIG. 11 conceptually shows a crystal plane orientation-measuring apparatus in accordance with the Laue method (side surface reflection method).

The Laue method includes three types of the transmission type, the back surface reflection type, and the side surface reflection type depending on the difference in the X-ray source, the crystal (measurement objective), and the relative positional relationship of the Laue camera. In the case of the transmission type, the Laue camera is arranged at the back of the crystal in order to record the diffraction beam in the traveling direction of the X-ray. In the case of the back surface reflection type, the Laue camera is arranged between the crystal and the X-ray source. The incident beam passes through a hole bored through a film, and the beam arrives at the crystal. The diffraction beam directed toward the X-ray source is recorded on the film. In the case of the side surface reflection type, the X-ray source is arranged so that the beam comes into the crystal at a certain angle of incidence ω. The Laue cameral is arranged at a predetermined angle with respect to the incident beam in order to record the diffraction beam in an arbitrary side surface direction. In any type, the position of the Laue spot is determined by the relative relationship of the crystal with respect to the incident beam. Therefore, this fact is applied to determine the crystal plane orientation. FIG. 11 shows a Laue apparatus of the side surface reflection type.

The Laue method makes it possible to conveniently measure a variety of crystal plane orientations, in which the reliability is high and the time required for the measurement is sufficiently short as well. Therefore, the Laue method is suitable for the present invention. Especially, in the case of the side surface reflection type, the X-ray is allowed to come into the sample surface at an angle of incidence of 60°. Therefore, a merit is obtained such that the crystal is less damaged as the permeation of the X-ray is shallow. It is affirmed that the Laue method is preferred for the present invention.

In the present invention, a large crystal having a dimension of, for example, φ300 mm×t66 mm is handled. Therefore, it is convenient to use a method as described below. At first, a measurement objective is placed flatly on a stage, and an X-ray source and a Laue camera are installed thereunder. When the measurement objective is placed flatly on the stage, it is easy to evaluate the surface of the large sample in detail. The measurement of the crystal plane orientation is synonymous with the measurement of the crystal axis orientation. That is, the measurement of the {111} plane orientation is equivalent to the measurement of the <111> axis orientation.

In order to decrease the amount of birefringence, a heat treatment is applied to the measurement objective having been judged to be usable as an optical element in accordance with the twin evaluation, followed by being applied with processing including, for example, the grinding, the polishing, and the coating with an antireflection film to be finally finished into the optical element such as a lens or a prism. An optical system is constructed by appropriately combining optical elements including, for example, lenses, prisms, and reflecting mirrors having a variety of shapes, and incorporating them into a lens barrel. The optical system constructed as described above is incorporated into a main exposure apparatus body to construct an exposure apparatus for photolithography.

Figure 12:
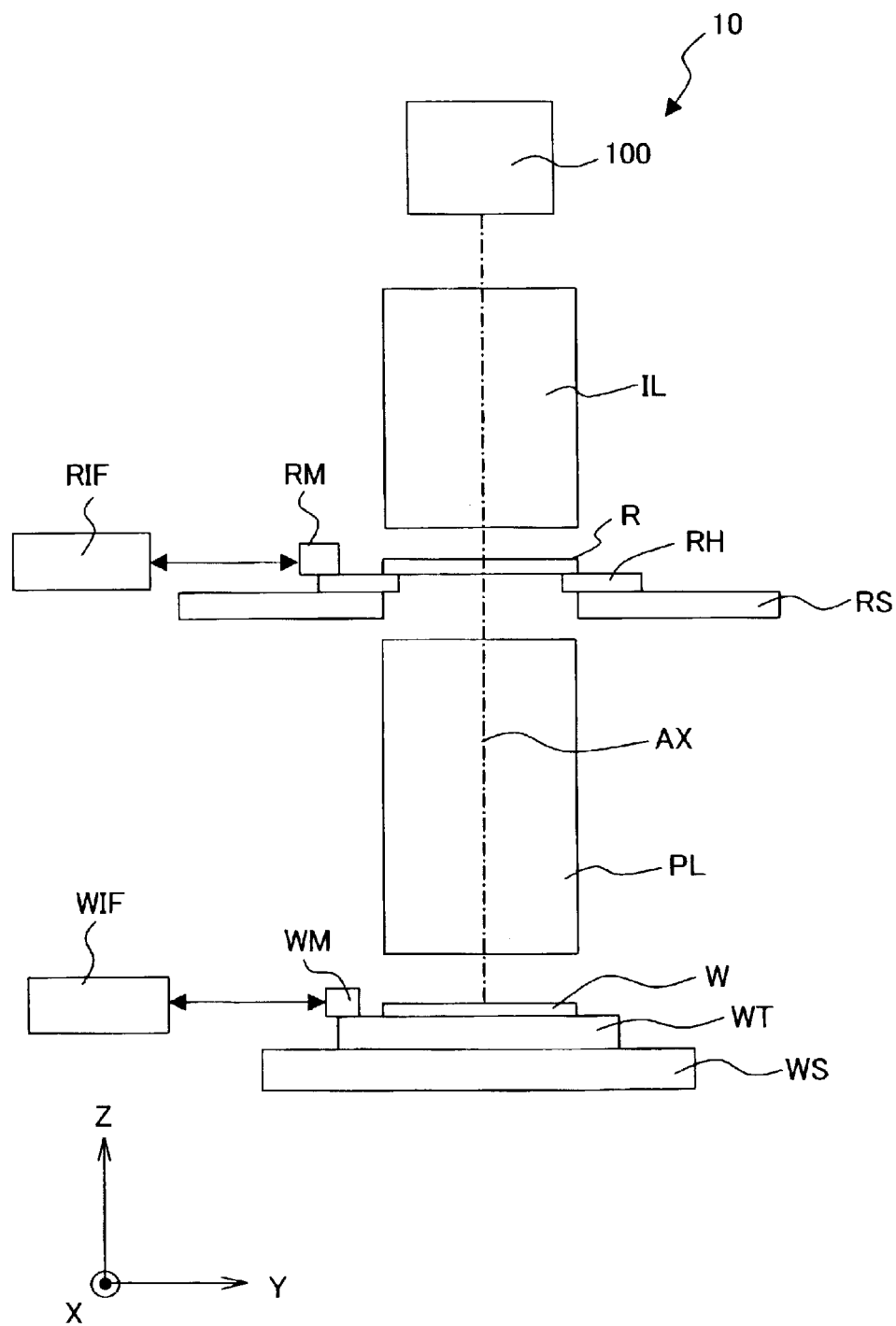
FIG. 12 conceptually shows an exposure apparatus for lithography to use a light source of an $F_2$ laser according to the present invention.

FIG. 12 conceptually shows an exposure apparatus 10 for photolithography to use a light source of an $F_2$ laser. With reference to FIG. 12, reference numeral 100 indicates an $F_2$ laser light source (oscillation central wavelength: 157.6 nm), IL indicates an illumination optical system, PL indicates a projection optical system, R indicates a reticle, and W indicates a silicon wafer subjected to the reduction projection. The light beam, which is radiated from the light source 100, passes through the illumination optical system IL, and the reticle R, on which a predetermined pattern is formed, is illuminated with the light beam at a uniform illuminance.

The optical path between the light source 100 and the illumination optical system IL is hermetically closed by a casing (not shown). The space, which ranges from the light source 100 to the lens disposed closest to the illumination optical system IL with respect to the reticle, is filled with an inert gas having a low absorption with respect to the exposure light beam. The reticle R is held by a reticle holder RH so that the reticle R is parallel to the XY plane on a reticle stage RS. The pattern, which is to be transferred onto the wafer W, is formed on the reticle R. A rectangular (slit-shaped) area of the entire pattern area, which has a short side in the X direction and which has a long side in the Y direction, is illuminated.

The reticle stage RS is movable two-dimensionally along the reticle plane (i.e., the XY plane). The position coordinate of the reticle stage RS is measured by a reticle interferometer RIF based on the use of a reticle movement mirror RM, and the position of the reticle stage RS is controlled thereby. The light beam, which has passed through the pattern formed on the reticle R, forms a reticle pattern image on the wafer W as a photosensitive substrate via the projection optical system PL. The wafer W is held by the aid of a wafer table WT so that the wafer W is parallel to the XY plane on the wafer stage WS. The wafer stage WS is movable two-dimensionally along the XY plane so that a rectangular exposure area, which has a short side in the X direction and which has a long side in the Y direction on the wafer W, optically corresponds to the rectangular illumination area on the reticle R. The position coordinate of the wafer table WT is measured by a wafer interferometer WIF by using a wafer movement mirror WM, and the position of the wafer table WT is controlled thereby.

The projection optical system PL is constructed so that the gas-tight state is retained therein. The internal space of the projection optical system PL is filled with the inert gas. The reticle R, the reticle stage RS, and other components are arranged in the narrow optical path between the illumination optical system IL and the projection optical system PL. The interior of the casing (not shown) for hermetically closing and surrounding the reticle R, the reticle stage RS, and other components is filled with the inert gas.

As described above, the atmosphere, in which the exposure light beam is scarcely absorbed, is formed over the entire optical path ranging from the light source 100 to the wafer W. As described above, each of the illumination area on the reticle R and the exposure area on the wafer W illuminated through the projection optical system PL has the rectangular shape which has the short side in the X direction. Therefore, when the reticle stage RS and the wafer stage WS are synchronously moved (scanned) in the short side direction of the rectangular illumination area and the exposure area, i.e., in the X direction while controlling the positions of the reticle R and the wafer W by using, for example, the driving systems and the interferometers (RIF, WIF), the area on the wafer W, which has the width equal to the long side of the exposure area and which has the length corresponding to the movement (scanning) amount of the wafer W, is subjected to the scanning exposure with the reticle pattern.

Figure 13:
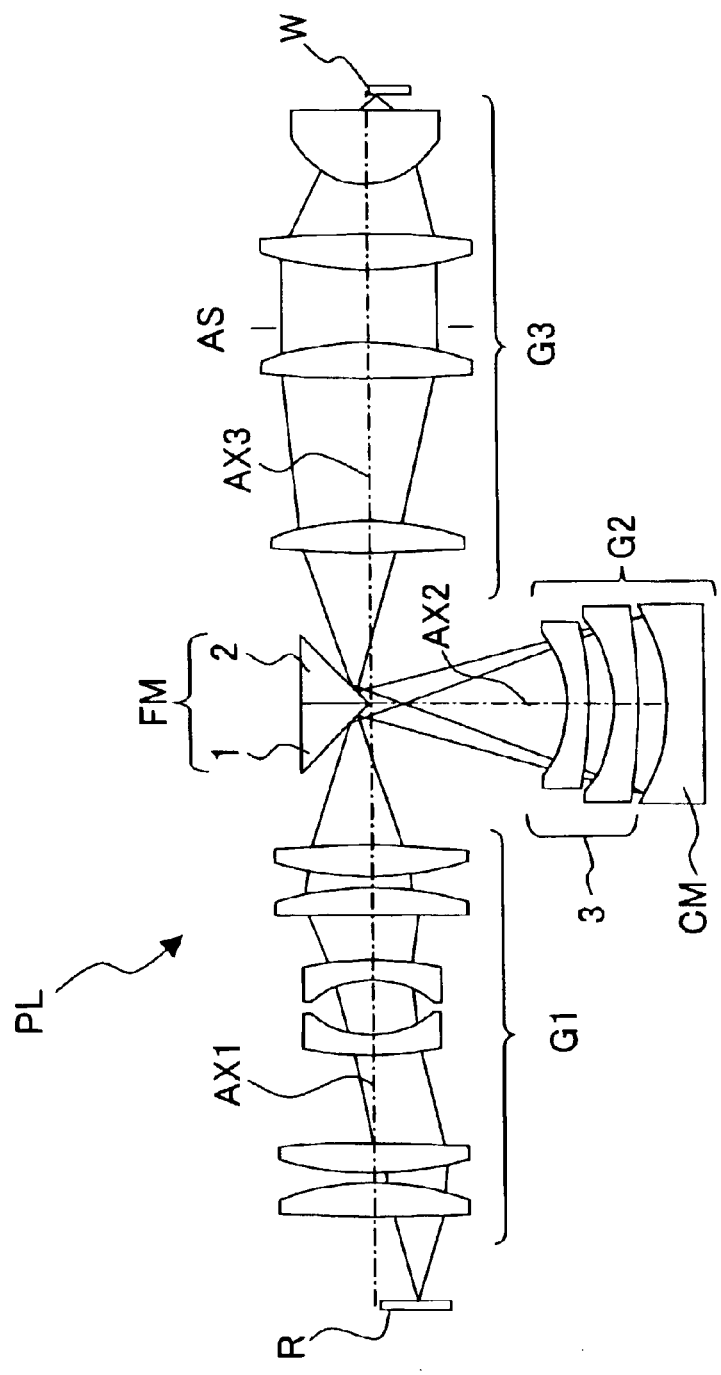
FIG. 13 conceptually shows a projection optical system of the exposure apparatus for lithography to use the light source of the $F_2$ laser according to the present invention.

When the construction as described above is used, the photolithography, in which a fine and clear pattern is obtained, is successfully realized. According to the present invention, it is possible to obtain a pattern in which the line width is not more than 0.3 $\mu$m. Next, a detailed explanation will be made with reference to FIG. 13 about the projection optical system PL to be used for the exposure apparatus for photolithography to use the $F_2$ laser as the light source according to the present invention. FIG. 13 conceptually shows an example of the projection optical system PL. The projection optical system shown in FIG. 13 comprises a first image-forming optical system G1, an optical path-folding mirror FM, a second image-forming optical system G2, and a third image-forming optical system G3. The optical path-folding mirror FM is composed of a first optical path-folding mirror 1 and a second optical path-folding mirror 2. The first image-forming optical system G1 forms a first intermediate image of the pattern formed on the reticle R as a projection master plate. The first optical path-folding mirror 1 is arranged in the vicinity of the first intermediate image, and it folds the optical axis AX1 of the first image-forming optical system G1 in the direction of the optical axis AX2 of the second image-forming optical system G2. The second image-forming optical system G2 includes a concave mirror CM and at least one concave lens, and it forms a second intermediate image. The second optical path-folding mirror 2 is arranged in the vicinity of the second intermediate image, and it folds the optical axis AX2 of the second image-forming optical system G2 in the direction of the optical axis AX3 of the third image-forming optical system G3. The third image-forming optical system G3 forms, on the wafer W, a reduction image of the pattern formed on the reticle R. The third image-forming optical system G3 also has a variable aperture stop AS for controlling the coherence factor.

FIG. 13 is illustrative of the projection optical system provided with the first image-forming optical system G1, the second image-forming optical system G2, and the third image-forming optical system G3 each having the plurality of lenses. However, the number of lenses of each of the image-forming optical systems is not limited to the number of lenses shown in FIG. 13. Further, the angles formed between the optical axis AX1 and the optical axis AX2 and between the optical axis AX2 and the optical axis AX3 are not necessarily 90°. However, it is desirable that the reticle R and the wafer W are parallel to one another.

In the projection optical system as described above, as having been already explained, the image formation performance on the wafer plane is badly affected when the twin exists in the optical element such as the lens for constructing the optical system. However, the degree of the influence exerted on the image formation performance is not necessary identical in all of the lenses. Taking notice of the diameter of the light flux radiated from one point on the reticle R and collected onto one point on the wafer (referred to as "partial diameter"), it is appreciated that the light flux diameters (partial diameters) of the lenses disposed closely to the reticle R are smaller than the light flux diameters of the lenses disposed remotely from the reticle R in the case of the first image-forming optical system G1. In the case of the third image-forming optical system G3, it is appreciated that the light flux diameters of the lenses disposed closely to the second optical path-folding mirror 2 and the wafer W are smaller than the light flux diameters of the lenses disposed approximately at intermediate positions between the both. Even when the defects have an identical size, the smaller the partial diameter is, the larger the influence is. The degree of the influence exerted by the lens defect on the image formation performance on the wafer is not uniform depending on the lens. The smaller the partial diameter is, the larger the influence of the defect existing in the lens is. That is, as for the twin, the smaller the partial diameter of the lens is, the larger the influence is as well. Therefore, the evaluation can be made more reasonably by defining the size of the twin region in relation to the partial diameter.

According to studies performed by the present inventors, the image formation performance is not greatly deteriorated when the twin region of the optical element is not more than 10% of the partial diameter, and the image formation performance is obtained more satisfactorily when the twin region of the optical element is not more than 5% of the partial diameter. In the foregoing description, the evaluation of the twin is made for the optical member before applying the processing into the optical element. However, it is also allowable to evaluate the twin after preparing the optical element by applying the processing.

Figure 1:
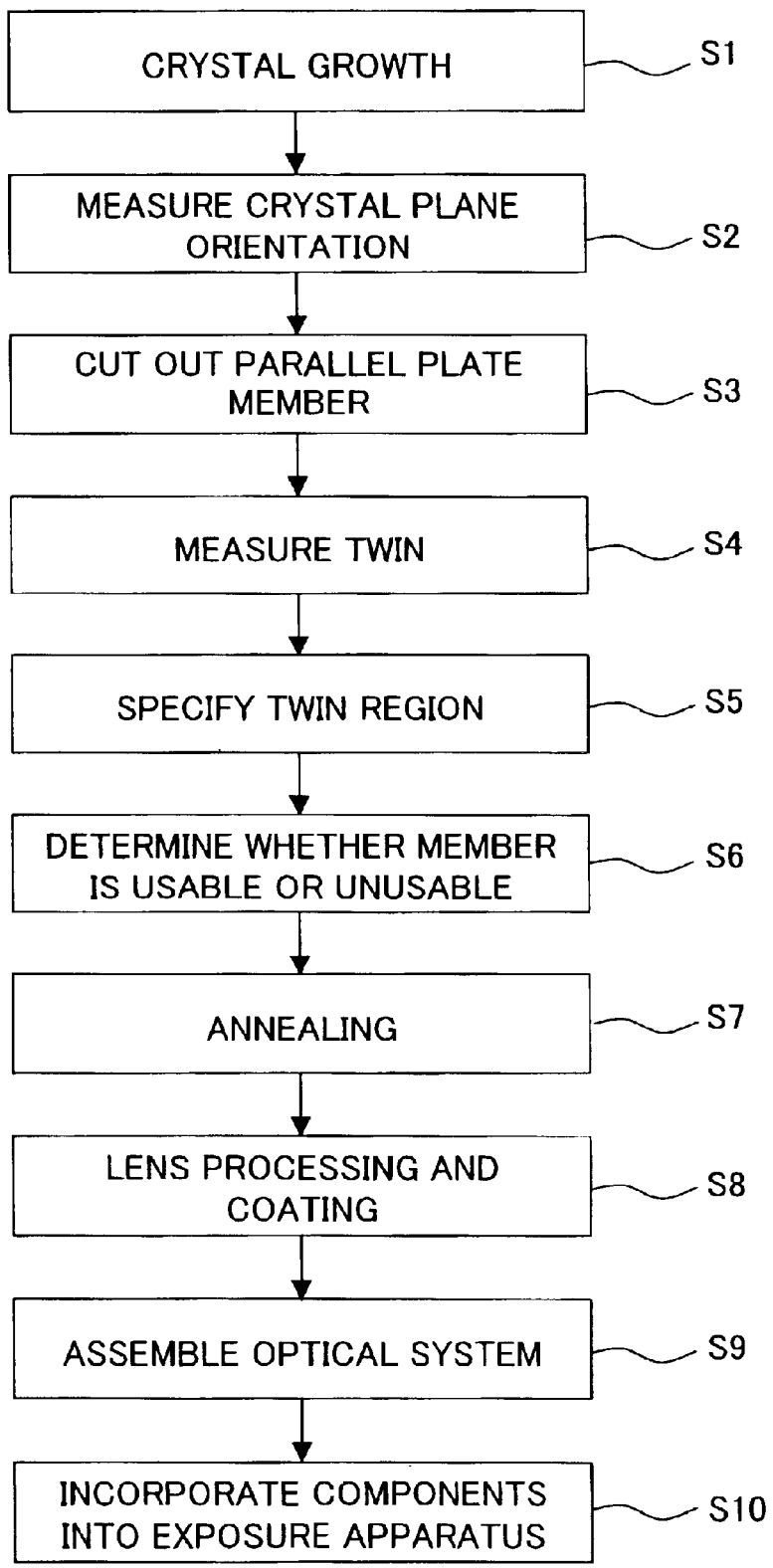
FIG. 1 shows a flow chart illustrating a method for evaluating an optical member according to the present invention.

The evaluation will be specifically described below with Example by way of example in reference with a flowchart of FIG. 1.

EXAMPLE 1

Figure 14:
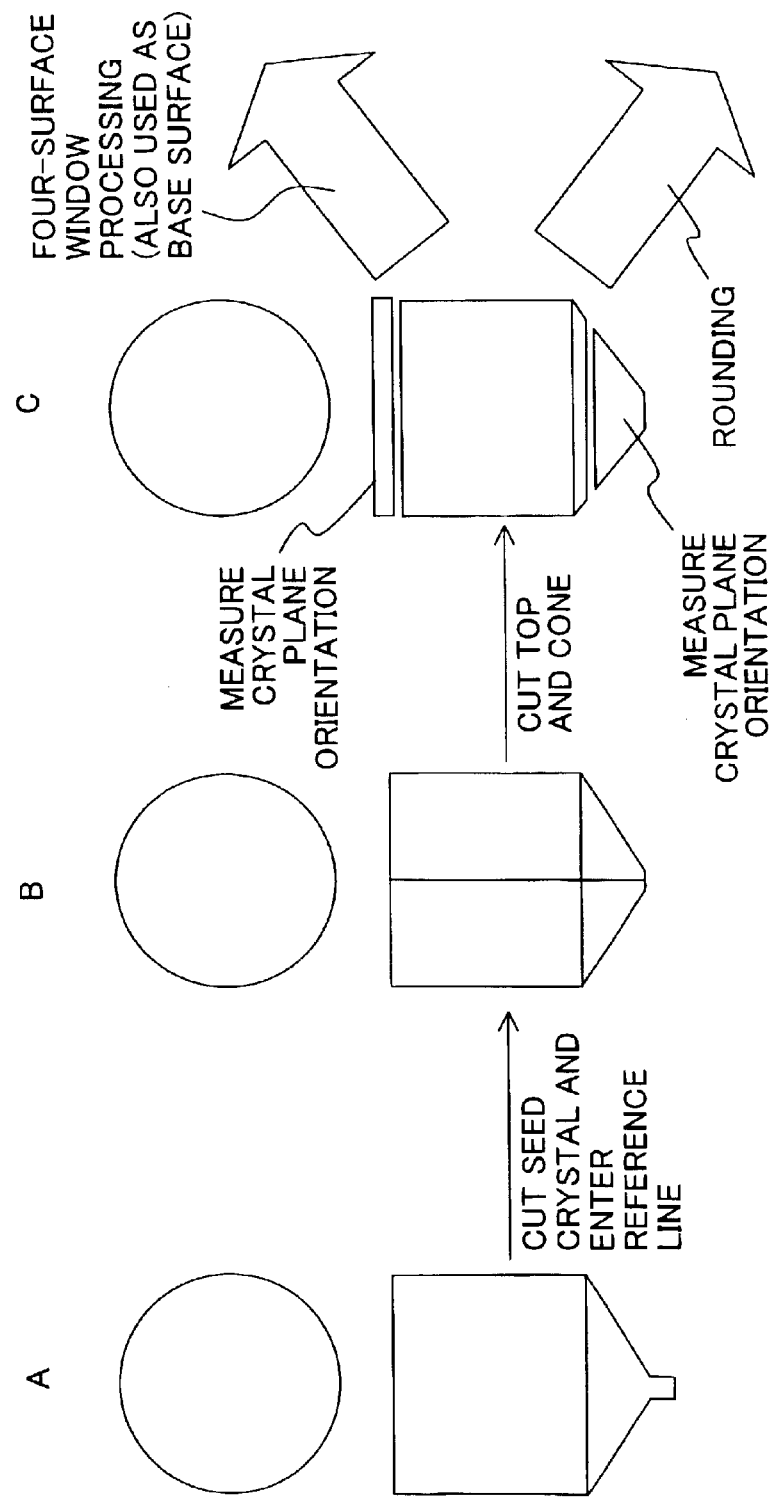
FIG. 14 conceptually shows steps of processing an optical member from an ingot of fluoride crystal.

A single crystal ingot of calcium fluoride was produced by the Bridgman method (S1). Test pieces for measuring the crystal plane orientation, each of which has a thickness of not less than 30 mm, are sliced from a cone section and a top section of the single crystal (FIG. 14). The crystal plane orientation is measured for the test pieces by means of the Laue method to specify the crystal plane orientation of the ingot (S2). If the ingot is a complete single crystal, the crystal plane orientation of the entire ingot can be specified by measuring any one of the crystal plane orientations of the cone section and the top section at one position. However, the ingot is not the complete single crystal in some cases. Therefore, it is desirable that the crystal plane orientations are measured at several points of the cone section and the top section to confirm that the obtained measurement results are not conflictive with each other.

The remaining main ingot body, which is obtained after slicing the cone section and the top section, is processed as follows. That is, the side surface portion is cut off (subjected to the rounding processing) from the remaining main ingot body, and then the portion is processed into a surface equivalent to the surface obtained by the sanding finish. Subsequently, a part of the side surface portion is subjected to the surface grinding to form a flat portion having a width of several centimeters. Matching oil, which has approximately the same refractive index as that of calcium fluoride, is applied to the portion to decrease the apparent surface roughness so that the interior of the ingot is easily observed. In this state, the ingot is irradiated with a light beam in a dark room. The light beam, which is transmitted through the ingot, is observed with a cross nicol optical system to investigate, for example, the stress concentration at boundary areas. Further, for example, the subgrain boundary, the state of polycrystal, and the position of the boundary areas are confirmed by observing the flat surface portion. Further, situations of internal bubbles and foreign matters are also confirmed.

Subsequently, a parallel plate-shaped material is cut out from the ingot so that the {111} plane corresponds to parallel two planes (S3). The surface of the cut out material is evaluated in detail in accordance with the Laue method (S4) to specify the twin region and determine the effective region of an optical element to be produced from the material or the ratio of the twin with respect to the partial diameter (S5). Those in which the twin ratio is not more than 10% are passed to the next step, and those in which the twin ratio is larger than the above are not used.

An explanation will now be made about an automatic measuring apparatus based on the Laue method of the side surface reflection type. The automatic measuring apparatus comprises an X-ray source, a sample stage, and a CCD camera. The apparatus is constructed such that the sample is placed flatly on the stage, and the X-ray source and the CCD camera are installed thereunder. Owing to the construction as described above, the evaluation is easily made in detail even in the case of a large sample. The X-ray tube is equipped with a W target. The X-ray tube is driven at a tube voltage of 50 kV and a tube current of 40 mA, and the maximum output is 2 kW. The X-ray, which is generated by the X-ray tube, is converted into a parallel beam by a double pin hole collimator having a diameter of about φ1 mm. The beam comes into the sample in a state in which the beam is converged to have a beam diameter of about φ2 mm. The X-ray is radiated for a period of time of about 1 minute. The diffracted beam is projected onto a fluorescent plate, which is photographed with the CCD camera. An obtained image is incorporated as a Laue pattern into a computer. CCD is cooled to about −50° C. by using a Peltier element to maintain the SN ratio. The Laue pattern image, which is incorporated into the computer, is analyzed on an orientation analysis screen. The Laue pattern is composed of a plurality of dot arrays. One dot array represents the diffraction spot resulting from the same zone axis. When four spots are selected and designated with a mouse from the spots (intersections of the dot arrays) belonging to a plurality of zone axes, Miller indexes are automatically appended for the respective intersections. When the indexes of the four spots are coincident with each other, the simulation pattern and the Laue pattern are displayed in a superimposed manner. An operator for the measurement judges whether or not the simulation pattern and the Laue pattern are coincident with each other. When the Miller indexes are determined, a result of the orientation analysis is outputted. The plane orientation angle is expressed in a coordinate system in which the X axis direction extends toward the back of the sample stage, and the Z axis direction extends in the vertical downward direction of the sample stage. In this coordinate system, the angle, which is formed by the Z axis and each of the orientation axes, is represented by α, and the angle, which is formed counterclockwise by a line obtained by projecting each of the orientation axes onto the measurement plane from the X axis in the plus direction, is represented by β.

Figure 15:
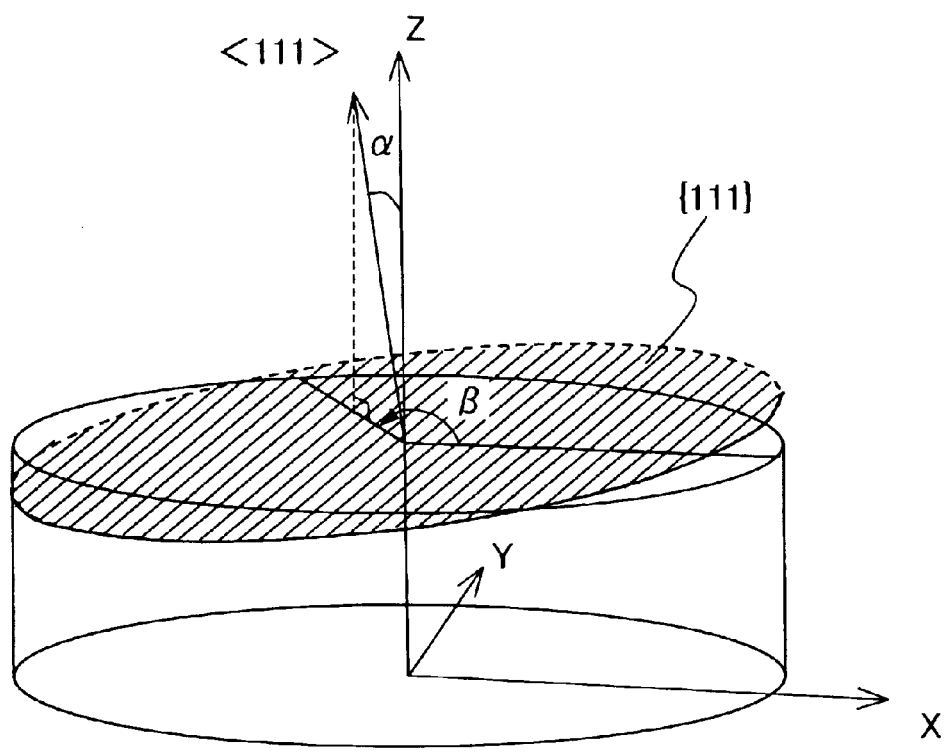
FIG. 15 illustrates the concepts of $\alpha$ and $\beta$ in a parallel plate-shaped optical member.

FIG. 15 illustrates the concepts of α and β in relation to the <111> axis in the parallel plate-shaped member 20. In this procedure, if the {111} plane correctly corresponds to the parallel two planes in the parallel plate-shaped member, the <111> axis is perpendicular to the measurement plane. Therefore, α=0 is given, and β is absent as well. However, actually, it is exceptional that the cut surface entirely coincides with the {111} plane. The <111> axis has a slight inclination with respect to the Z axis. Therefore, numerical values of α and β are usually displayed.

Figure 16:
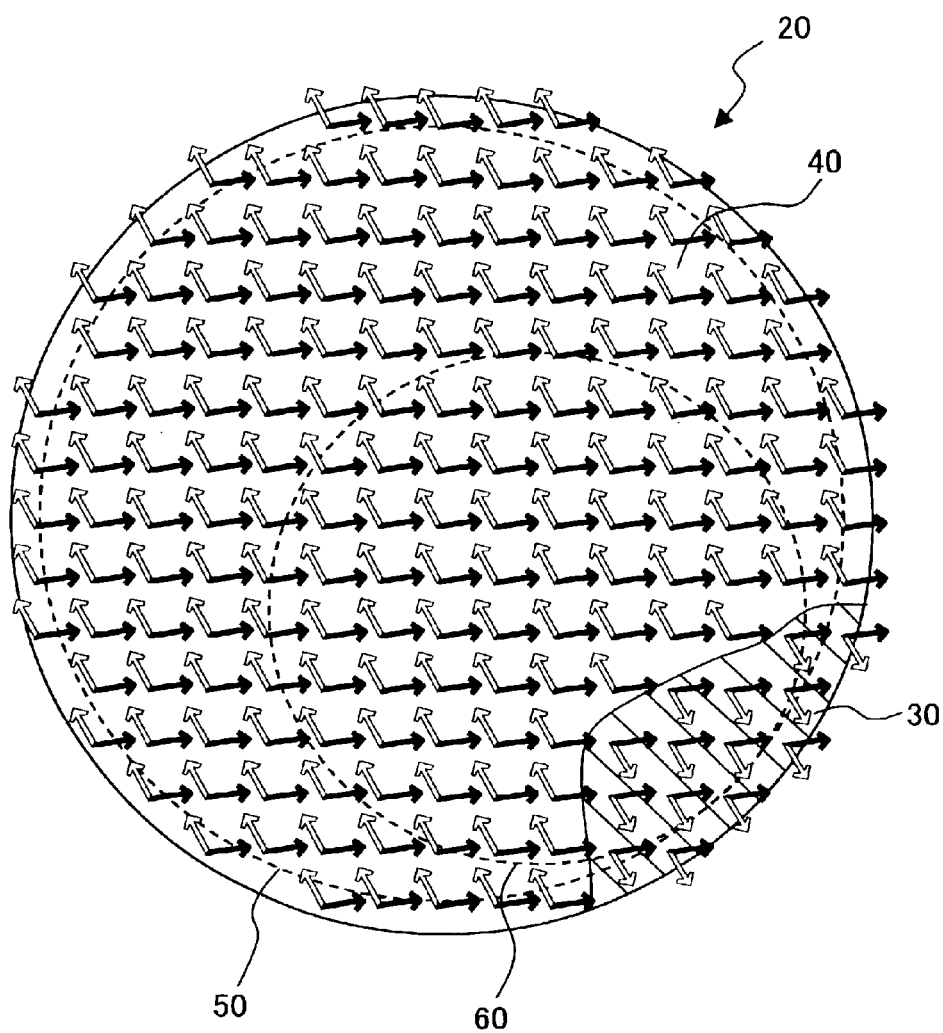
FIG. 16 shows the measurement of mapping of the crystal plane orientation of the optical member in accordance with the Laue method.

The surface of the optical member 20 cut out to have the parallel plate-shaped form was measured at intervals of 2 mm, α and β were measured in relation to the <111> axis and the <100> axis at the respective measuring points, and the directions of β of the respective axes were indicated by arrows to complete the mapping. An example of the mapping is shown in FIG. 16. According to FIG. 16, it is appreciated that the <111> axes are directed in the same direction over the entire measurement surface, while the directions of the <111> axes are inverted by 180° in the lower-right hatched portion 30 as compared with those disposed in the other region 40. That is, it can be specified that the hatched portion is the twin. Two circular regions are surrounded by broken lines. The larger circular region 50 indicates the effective diametral region of the lens to be produced from the optical member. The smaller circular region 60 indicates the partial diametral region which includes the maximum amount of the twin region 30 in the lens. In this example, it can be judged that the twin region 30 is less than 10% with respect to the effective diametral region of the lens, but the twin region exceeds 10% with respect to the partial diametral region. That is, the area of the twin region 30 can be specified, and the ratios of the twin region occupied with respect to the effective diametral region and the partial diametral region of the optical element can be determined.

Accordingly, any optical member, in which the twin region exceeds 10% with respect to the partial diametral region, is judged to be unsuitable, and such an optical member is not used for the following treatment (S6). In this case, another optical member is cut out from the ingot described above or from another ingot produced separately, in the same manner as described above to specify the twin region in the same manner as described above. Thus, the optical member, in which the twin region does not exceeds 10% with respect to the partial diametral region in the judgment step, is obtained. In this embodiment, the material is cut out in the parallel plate-shaped form so that the {111} plane corresponds to the parallel two surfaces. However, it goes without saying that the same or equivalent method may be also adopted when the material is cut out so that another plane corresponds to the parallel two surfaces. A heat treatment is applied (S7) to the parallel plate-shaped material having been judged to be useable as the optical element by evaluating the twin. The heat treatment is performed in order to reduce the birefringence and improve the image formation performance of the optical element. Specifically, the parallel plate-shaped material is installed in a vessel of a heat treatment apparatus so that the flat surfaces are disposed at the top and the bottom. The heat is applied with a heater to arrive at a temperature of about 1080° C. to perform the heat treatment. During this process, in order to exclude oxygen which would cause any haze of calcium fluoride, the interior of the heat treatment apparatus is in a vacuum state.

The main heat treatment apparatus body is made of stainless steel, which is provided with a heater made of graphite and a vessel made of graphite therein. When the heat treatment is performed, about 100 g of acidic ammonium fluoride is introduced together with the material. Acidic ammonium fluoride is used in order that oxygen in the apparatus is completely excluded, and the stainless steel portions of the inner surface of the heat treatment apparatus are simultaneously coated with fluoride. After the interior of the apparatus is allowed to be in a vacuum state by using a vacuum pump, the temperature-raising operation is started. The vaporization of acidic ammonium fluoride begins approximately at a point of time at which the temperature in the apparatus exceeds 500° C. The internal pressure of the apparatus is changed to a slightly positive pressure, giving a state in which the pressure is higher than the atmospheric pressure by 2 to 8 kPa. The temperature is raised up to 1080° C. while controlling the pressure so that this state is maintained. The temperature is retained for a predetermined period of time, followed by being gradually cooled.

When the heat treatment is performed as described above, it is possible to minimize the amount of birefringence which would be caused by the thermal stress in all of the crystal plane orientations of the calcium fluoride material. After the heat treatment, the calcium fluoride material is subjected to the predetermined processing including, for example, the grinding, the polishing, and the coating with an antireflection film, and thus the optical element is prepared (S8). The optical elements prepared as described above are appropriately combined to construct the optical system which is incorporated into the projection exposure apparatus (S9, S10). That is, each of the optical elements is processed so that the {111}, {100}, or {110} crystal plane corresponds to the parallel two surfaces. It is confirmed that the plane orientations of the respective optical elements conform to the optical design values (within 3°). After that, as for the lens in which the <111> axis is allowed to coincide with the optical axis, the birefringence is offset with another lens in which the <110> axis is rotated about the <111> axis by 60°. As for the lens in which the <100> axis is allowed to coincide with the optical axis, the birefringence is offset with another lens in which the <110> axis is rotated by 45°. As for the lens in which the <110> axis is allowed to coincide with the optical axis, the birefringence is offset with other three lenses in which the <111> axis and <100> axis are rotated by 45°, 90°, and 135°. When the optical system is constructed as described above, it is possible to obtain the image formation performance appropriate as the projection lens. When the Strehl value depending on the birefringence distribution was measured, the value was 0.99. The performance appropriate as the projection optical system was successfully obtained.

The influence of the still remaining birefringence may be dealt with as follows. That is, for example, a crystal of silica glass, calcium fluoride, or barium fluoride is produced in which the birefringence distribution is controlled to counteract the birefringence of calcium fluoride. The birefringence distribution of the crystal of, for example, silica glass, calcium fluoride, or barium fluoride produced as described above is measured, and the crystal is inserted into the optical system to effect correction. Thus, the image formation performance can be further improved as well. In this procedure, it goes without saying that the crystal plane orientation is required to be managed for the crystal material.

The management of the twin of the optical member, which is performed in the present invention as described above, is extremely important to secure the performance of the optical system. It is possible to maximally derive the image formation performance of the optical system by more precisely managing the twin region of the lens one by one.

Comparative Example 1

An optical system was constructed in the same manner as in Example 1 by using a lens in which the twin region exceeded 10% of the effective diametral region or the partial diametral region of each of optical members. The Strehl value depending on the birefringence distribution was measured. As a result, the value was 0.91, in which it was unsuccessful to obtain any enough performance for the projection optical system.

Comparative Example 2

An optical system was constructed in the same manner as in Example 1 by using five lenses in each of which the twin region exceeded 10% of the effective diametral region or the partial diametral region of each of optical members. The Strehl value depending on the birefringence distribution was measured. As a result, the value was 0.82, in which it was unsuccessful to obtain any enough performance for the projection optical system.

The present invention has been specifically explained above with reference to the specified embodiments. However, the present invention is not limited thereto, which also includes those conceivable from the specified embodiments by those skilled in the art. The scanning exposure apparatus shown in FIG. 12 is merely an example of the exposure apparatus. The optical element of the present invention is applicable to optical systems of exposure apparatuses of a variety of types including, for example, those of the full field exposure type and the proximity type. The optical element of the present invention may be used not only for the projection optical system but also for the illumination optical system. Details of the exposure apparatus are described, for example, in U.S. Pat. Nos. 6,391,503 B2 and 6,400,441 B1, the contents of which are incorporated herein by reference.

As explained above, according to the present invention, it is possible to provide the optical member which involves less twin, and it is possible to secure the desired image formation performance.

What is claimed is:

1. A method for evaluating an optical member for photolithography composed of a fluoride crystal, the method comprising the steps of:

measuring a crystal plane orientation of the optical member; and specifying a twin region on the basis of a result of the measurement.

2. The method for evaluating the optical member according to claim 1, further comprising a step of calculating a ratio occupied by the specified twin region with respect to an effective region of an optical element to be produced from the optical member.

3. The method for evaluating the optical member according to claim 1, wherein the step of measuring the crystal plane orientation of the optical member is performed by radiating an X-ray onto the optical member.

4. The method for evaluating the optical member according to claim 3, wherein the X-ray is radiated onto the optical member on the basis of a Laue method.

5. The method for evaluating the optical member according to claim 4, wherein the Laue method is of a side surface reflection type.

6. The method for evaluating the optical member according to claim 2, wherein the twin region is specified as a total area of a region obtained by projecting the twin region in the effective region onto a plane perpendicular to an optical axis of the optical element, and the effective region of the optical element is an effective diametral area of the optical element.

7. The method for evaluating the optical member according to claim 2, wherein the twin region is specified as a total area of a region obtained by projecting the twin region in the effective region onto a plane perpendicular to an optical axis of the optical element, and the effective region of the optical element is a partial diametral area of the optical element.

8. The method for evaluating the optical member according to claim 6, further comprising a step of judging that the optical member is usable when the total area is not more than 10% of the effective diametric area of the optical element.

9. The method for evaluating the optical member according to claim 7, further comprising a step of judging that the optical member is usable when the total area is not more than 10% of the partial diametric area of the optical element.

10. An optical element for photolithography to be used in a wavelength band in which a wavelength is not more than 250 nm, wherein:

a region, which is obtained by projecting a twin region of the optical element onto a plane perpendicular to an optical axis of the optical element, has a total area which is not more than 10% of an effective diametric area of the optical element.

11. An optical element for photolithography to be used in a wavelength band in which a wavelength is not more than 250 nm, wherein:

a region, which is obtained by projecting a twin region of the optical element onto a plane perpendicular to an optical axis of the optical element, has a total area which is not more than 10% of a partial diametric area of the optical element.

12. An optical system for photolithography to be used in a specified wavelength band in which a wavelength is not more than 250 nm, the optical system comprising:

the optical element as defined in claim 10; and a lens barrel into which the optical element is incorporated.

13. The optical system for photolithography according to claim 12, wherein the optical system is a projection optical system.

14. An exposure apparatus for photolithography to be used in a specified wavelength band in which a wavelength is not more than 250 nm, wherein:

the optical system as defined in claim 12 is incorporated.

15. An optical system for photolithography to be used in a specified wavelength band in which a wavelength is not more than 250 nm, the optical system comprising:

the optical element as defined in claim 11; and a lens barrel into which the optical element is incorporated.

16. The optical system for photolithography according to claim 15, wherein the optical system is a projection optical system.

17. An exposure apparatus for photolithography to be used in a specified wavelength band in which a wavelength is not more than 250 nm, wherein:

the optical system as defined in claim 15 is incorporated.

18. A method for producing an optical system for photolithography to be used in a specified wavelength band in which a wavelength is not more than 250 nm, the method comprising the steps of:

preparing an optical member which is judged to be usable by using the evaluation method as defined in claim 8;

grinding and polishing the optical member and coating the optical member with an antireflection film or a reflection film to produce an optical element having a predetermined shape; and incorporating the optical element into a lens barrel to produce the optical system thereby.

19. A method for producing an optical system for photolithography to be used in a specified wavelength band in which a wavelength is not more than 250 nm, the method comprising the steps of:

preparing an optical member which is judged to be usable by using the evaluation method as defined in claim 9;

grinding and polishing the optical member and coating the optical member with an antireflection film or a reflection film to produce an optical element having a predetermined shape; and incorporating the optical element into a lens barrel to produce the optical system thereby.

20. A method for producing an exposure apparatus for photolithography to be used in a specified wavelength band in which a wavelength is not more than 250 nm, the method comprising the steps of:

preparing an optical member which is judged to be usable by using the evaluation method as defined in claim 8;

grinding and polishing the optical member and coating the optical member with an antireflection film or a reflection film to produce an optical element having a predetermined shape;

incorporating the optical element into a lens barrel to produce an optical system thereby; and attaching the optical system to a predetermined position of the exposure apparatus.

21. A method for producing an exposure apparatus for photolithography to be used in a specified wavelength band in which a wavelength is not more than 250 nm, the method comprising the steps of:

preparing an optical member which is judged to be usable by using the evaluation method as defined in claim 9;

grinding and polishing the optical member and coating the optical member with an antireflection film or a reflection film to produce an optical element having a predetermined shape;

incorporating the optical element into a lens barrel to produce an optical system thereby; and attaching the optical system to a predetermined position of the exposure apparatus.

* * * * *